United States Patent
Duduta et al.

(10) Patent No.: US 12,193,334 B2
(45) Date of Patent: Jan. 7, 2025

(54) MANUFACTURING TECHNIQUES AND DEVICES USING DIELECTRIC ELASTOMERS

(71) Applicant: President and Fellows of Harvard College, Cambridge, MA (US)

(72) Inventors: Mihai Duduta, Somerville, MA (US); David Clarke, Cambridge, MA (US); Robert J. Wood, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 909 days.

(21) Appl. No.: 16/087,431

(22) PCT Filed: Mar. 20, 2017

(86) PCT No.: PCT/US2017/023186
§ 371 (c)(1),
(2) Date: Sep. 21, 2018

(87) PCT Pub. No.: WO2017/165282
PCT Pub. Date: Sep. 28, 2017

(65) Prior Publication Data
US 2019/0103549 A1    Apr. 4, 2019

Related U.S. Application Data

(60) Provisional application No. 62/311,029, filed on Mar. 21, 2016.

(51) Int. Cl.
*H01L 41/193* (2006.01)
*C08G 59/18* (2006.01)
(Continued)

(52) U.S. Cl.
CPC .......... *H10N 30/857* (2023.02); *C08G 59/18* (2013.01); *C08G 59/22* (2013.01); *C08K 3/013* (2018.01);
(Continued)

(58) Field of Classification Search
CPC ....... H01L 41/27; H01L 41/45; H01L 41/083; H01L 41/193; H01L 41/253;
(Continued)

(56) References Cited

U.S. PATENT DOCUMENTS 7,921,541 B2    4/2011  Pei et al.
8,921,473 B1 *  12/2014 Hyman ................... C08K 3/04
                                                524/445

(Continued)

FOREIGN PATENT DOCUMENTS

WO    WO 2015/023803 A1    2/2015

OTHER PUBLICATIONS

International Search Report and Written Opinion mailed Aug. 2, 2017 in connection with International Application No. PCT/US17/23186.

(Continued)

*Primary Examiner* — Dedei K Hammond
*Assistant Examiner* — Monica Mata
(74) *Attorney, Agent, or Firm* — Wolf, Greenfield & Sacks, P.C.

(57) ABSTRACT

In some embodiments, a dielectric elastomer device may include at least first and second dielectric elastomer layers, and a first layer of conductive particles disposed between the first and second dielectric elastomer layers and forming a first electrode of the device, wherein portions of the second dielectric elastomer layer are directly bonded with portions of the first dielectric elastomer layer through the first layer of the conductive particles. The dielectric elastomer layer (Continued)

may, for example, comprise a cured acrylic elastomer precursor with an additive including urethane, polybutadiene, or silicone. Electrodes in different layers may be interconnected by infusing a liquid or semi-liquid conductive material in contact with each of a plurality of the electrodes of the actuator or sensor device, and solidifying the conductive material to form a conductive path that interconnects the plurality of electrodes.

19 Claims, 12 Drawing Sheets

(51) Int. Cl.
| | |
|---|---|
| *C08G 59/22* | (2006.01) |
| *C08K 3/013* | (2018.01) |
| *C08L 33/08* | (2006.01) |
| *C08L 75/04* | (2006.01) |
| *C08L 83/04* | (2006.01) |
| *H01B 1/24* | (2006.01) |
| *H01L 41/047* | (2006.01) |
| *H01L 41/253* | (2013.01) |
| *H01L 41/297* | (2013.01) |
| *H01L 41/45* | (2013.01) |
| *H10N 30/04* | (2023.01) |
| *H10N 30/05* | (2023.01) |
| *H10N 30/067* | (2023.01) |
| *H10N 30/098* | (2023.01) |
| *H10N 30/50* | (2023.01) |
| *H10N 30/857* | (2023.01) |
| *H10N 30/87* | (2023.01) |
| *B82Y 30/00* | (2011.01) |
| *B82Y 40/00* | (2011.01) |

(52) U.S. Cl.
CPC ............ *C08L 33/08* (2013.01); *C08L 75/04* (2013.01); *C08L 83/04* (2013.01); *H01B 1/24* (2013.01); *H10N 30/04* (2023.02); *H10N 30/05* (2023.02); *H10N 30/067* (2023.02); *H10N 30/098* (2023.02); *H10N 30/50* (2023.02); *H10N 30/871* (2023.02); *H10N 30/878* (2023.02); *B82Y 30/00* (2013.01); *B82Y 40/00* (2013.01); *C08K 2201/001* (2013.01); *C08L 2203/20* (2013.01)

(58) Field of Classification Search
CPC ............ H01L 41/297; H01L 41/0471; H01L 41/0478; H01B 1/24; B82Y 30/00; B82Y 40/00; C08G 59/18; C08G 59/22; C08K 3/013; C08K 2201/001; C08L 33/08; C08L 75/04; C08L 83/04; C08L 2203/20; H10N 30/04; H10N 30/05; H10N 30/50; H10N 30/067; H10N 30/098; H10N 30/857; H10N 30/871; H10N 30/878
USPC .......................................................... 310/363
See application file for complete search history.

(56) References Cited

U.S. PATENT DOCUMENTS

| 2004/0063845 | A1 | 4/2004 | Guzauskas |
| 2016/0027995 | A1 | 1/2016 | Wagner et al. |
| 2017/0059419 | A1* | 3/2017 | Park .................. G01L 1/142 |

OTHER PUBLICATIONS

PCT/US17/23186, Aug. 2, 2017, International Search Report and Written Opinion.

* cited by examiner

MANUFACTURING TECHNIQUES AND DEVICES USING DIELECTRIC ELASTOMERS

RELATED APPLICATIONS

This application is a national stage filing under 35 U.S.C. § 371 of International Application Serial No. PCT/US2017/023186, filed Mar. 20, 2017, entitled "MANUFACTURING TECHNIQUES AND DEVICES USING DIELECTRIC ELASTOMERS", which claims the benefit of U.S. Provisional Application No. 62/311,029, filed Mar. 21, 2016, the entire contents of which are incorporated herein by reference.

FEDERALLY SPONSORED RESEARCH

This invention was made with Government support under DMR14-20570 awarded by National Science Foundation. The Government has certain rights in the invention.

BACKGROUND

Dielectric elastomers are a class of versatile transducers that hold great promise for muscle-like soft actuators, due to their ability to convert electrical into mechanical energy and vice versa. An example of a simple dielectric elastomer actuator (DEA) 100 is shown in FIG. 1. As shown, the DEA 100 includes a dielectric elastomer material 102 sandwiched between two compliant electrodes 104, 106. In its deactivated mode (i.e., when the applied voltage V=0 volts), the thickness of the elastomer material 102 is z. In the activated mode, a voltage V>0 is applied between the electrodes 104, 106 and the attractive Coulombic force between the opposing charges compresses the elastomer by an amount Δz, causing it to expand in the direction perpendicular to the applied electric field. The Maxwell pressure σ exerted on the elastomer material 102 can be defined by the equation:

$$\sigma = \frac{\varepsilon_0 \varepsilon_r}{E} \left(\frac{V}{t}\right)^2$$

where $\varepsilon_0$ is the permittivity of a vacuum, $\varepsilon_r$ is the dielectric constant of the elastomer material, E is the Young's modulus of the elastomer material, V is the applied actuation voltage, and t is the thickness of the elastomer material.

More complex shape changes can also be produced by introducing one or more passive structures that inhibit or block motion of portions of the DEA, thus producing out of plane actuation.

SUMMARY

In some embodiments, a method of making a dielectric elastomer device comprises depositing conductive particles on a first dielectric elastomer layer to form a first electrode of the device; applying a liquid elastomer over the conductive particles and the first dielectric elastomer layer so that the liquid elastomer covers the conductive particles and contacts portions of the first dielectric elastomer layer; and at least partially curing the liquid elastomer to form a second dielectric elastomer layer that is directly bonded with the contacted portions of the first dielectric elastomer layer.

In some embodiments, a dielectric elastomer device comprises at least first and second dielectric elastomer layers, and a first layer of conductive particles disposed between the first and second dielectric elastomer layers and forming a first electrode of the device, wherein portions of the second dielectric elastomer layer are directly bonded with portions of the first dielectric elastomer layer through the first layer of the conductive particles.

In some embodiments, a method of making a dielectric elastomer device comprises at least partially curing a liquid elastomer to form a dielectric elastomer layer; and depositing an electrode on the dielectric elastomer layer, wherein the liquid elastomer comprises an acrylic elastomer precursor with an additive including urethane, polybutadiene, or silicone.

In some embodiments, a dielectric elastomer device comprises a dielectric elastomer layer, and an electrode disposed on the dielectric elastomer layer, wherein the dielectric elastomer layer comprises a cured acrylic elastomer precursor with an additive including urethane, polybutadiene, or silicone.

In some embodiments, a method of interconnecting electrodes in different layers of a multi-layer dielectric elastomer actuator or sensor device comprises infusing a liquid or semi-liquid conductive material in contact with each of a plurality of the electrodes of the actuator or sensor device, and solidifying the conductive material to form a conductive path that interconnects the plurality of electrodes.

In some embodiments, a multi-layer dielectric elastomer actuator or sensor device comprises a plurality of dielectric elastomer layers interleaved with conductive layers that form a plurality of electrodes on different layers of the actuator or sensor device, and conductive particles forming a conductive path that interconnects the plurality of electrodes.

In some embodiments, a method making a multi-layer elastomer actuator or sensor device comprises forming a composite having a plurality of dielectric elastomer layers interleaved with conductive layers forming electrodes of the actuator or sensor device, and using a conformable conductive material to establish a conductive path between at least two of the conductive layers without increasing the Young's modulus of the composite by more than 2×.

In some embodiments, a multi-layer dielectric elastomer actuator or sensor device comprises a composite having a plurality of dielectric elastomer layers interleaved with conductive layers forming electrodes of the actuator or sensor device, and a conformable conductive material electrically interconnecting at least two of the conductive layers without increasing the Young's modulus of the composite by more than 2×.

In some embodiments, a method of making a dielectric elastomer actuator or sensor device comprises depositing a conductive layer on a dielectric elastomer layer such that the conductive layer comprises at least first and second electrically isolated conductive regions that form electrodes for respective actuator or sensor regions of the device.

In some embodiments, a dielectric elastomer actuator or sensor device comprises a dielectric elastomer layer, and a conductive layer deposited on the dielectric elastomer layer, the conductive layer comprising at least first and second electrically isolated conductive regions that form electrodes for respective actuator or sensor regions of the device.

In some embodiments, a method of making a multi-layer dielectric elastomer device comprises forming a composite having a plurality of dielectric elastomer layers interleaved with conductive layers, connecting at least two first portions of the conductive layers to first circuitry that is configured to operate a first region of the device as a first actuator, sensor, or electro-adhesive, and connecting at least two second portions of the conductive layers to second circuitry that is configured to operate a second region of the device as a second actuator, sensor, or electro-adhesive.

In some embodiments, a multi-layer dielectric elastomer device comprises a plurality of dielectric elastomer layers interleaved with conductive layers, and circuitry configured to generate and/or sense voltage signals, wherein at least two first portions of the conductive layers are connected to the circuitry to operate a first region of the device as a first actuator, sensor, or electro-adhesive, and at least two second portions of the conductive layers are connected to the circuitry to operate a second region of the device as a second actuator, sensor, or electro-adhesive.

DETAILED DESCRIPTION

Figure 1:
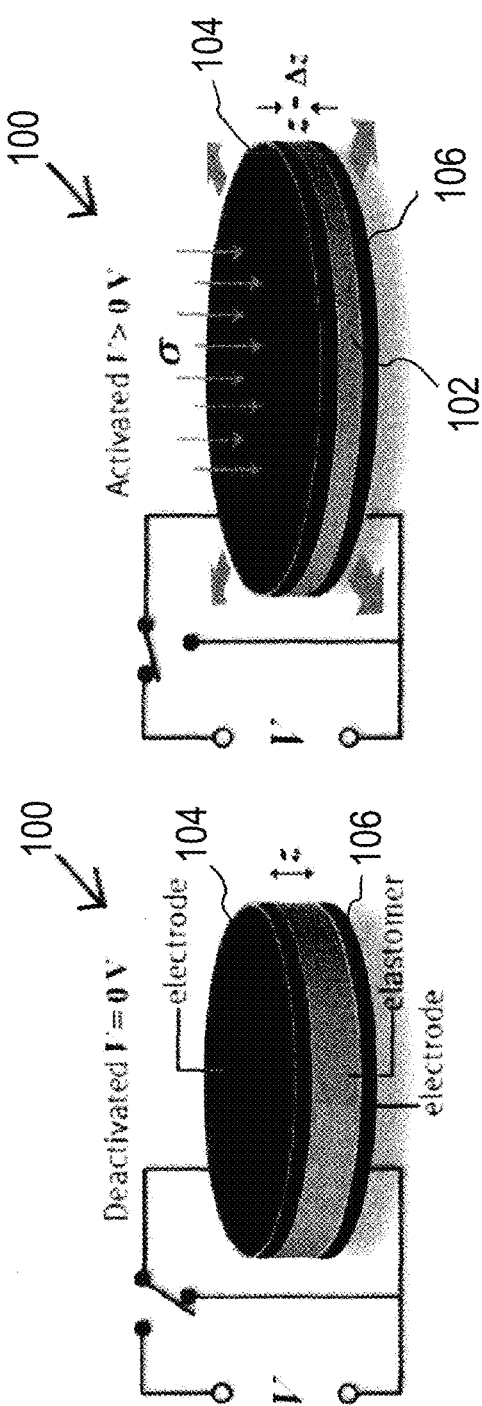
FIG. 1 shows a simple dielectric elastomer actuator.

The inventors have recognized and appreciated several limitations of existing DEAs that prevent their wider adoption. The first is the need for pre-stretching of the elastomer in order to attain large actuation strains. By pre-stretching, the well-established electromechanical instability is suppressed and higher actuation voltage can be attained before dielectric breakdown occurs. However, pre-stretching is typically achieved with the use of a rigid frame, which in turn limits the integration of DEAs with other soft components.

The second limitation of existing DEAs is the high voltage typically required for actuation (~100 V/μm). Smaller actuation voltages can be achieved by using much thinner elastomer films, but such films are very fragile and difficult to manipulate to create structures.

Third, the inherent stiffness of electrodes decreases the efficiency of existing DEAs. The development of multilayer actuators has improved robustness but as the thickness of the individual layers approaches the thickness of the electrodes, their combined stiffness limits the attainable actuation strains.

Fourth, existing multi-layer DEAs are susceptible to delamination due to inadequate adhesion between layers.

The inventors have recognized and appreciated that certain acrylic elastomers can not only effectively operate in a DEA without being pre-stretched but are also generally good adhesives and can incorporate a wider variety of conductors with minimal increase in stiffness, including conductive powders, such as carbon black, and silver nanowires. The inventors have also recognized and appreciated that certain acrylic compositions can also readily incorporate cylindrical conductive nanostructures, such as single wall carbon nanotubes (SWCNTs) dispersed into interconnected mattes, so the electrodes can be much thinner. Such nanostructures can also provide a conductive layer for an electrode that advantageously allows an applied liquid elastomer to permeate through and contact an underlying elastomer layer before the applied liquid elastomer is cured. This process allows the respective elastomer layers to be directly bonded, e.g., polymerized, with one another through the percolative electrode, thereby significantly increasing adhesion between layers of a multi-layer device.

The various materials and/or fabrication methods disclosed herein provide the opportunity to create novel actuator structures through the design and placement of the electrodes. These outcomes become possible when, for example, the electrode thickness is sufficiently small that the electrodes do not significantly alter the thickness or the stiffness of the elastomer layers.

In some embodiments, a dielectric elastomer that does not require pre-stretch may be employed as one or more layers of a dielectric elastomer actuator, sensor, or electroadhesive. Certain acrylic compositions may be suitable for forming such elastomers. Examples of such compositions include three elastomer oligomers (CN9021, CN9014 and CN9018) that can be obtained from Sartomer Company (Exton, PA). Chemically cross-liking polymer chains in the elastomers can create a stiffening effect similar to pre-stretching. A suitable cross-linker, HDDA (1,6-hexanediol diacrylate), can be procured from Sigma Aldrich (St. Louis, MO). All three of the aforementioned oligomers can be UV cured. The CN9021 oligomer was the basis for the composition reported in X. Niu, H. Stoyanov, W. Hu, R. Leo, P. Brochu, Q. Pei, Journal of Polymer Science Part B: Polymer Physics, 2013, 51, 3, which is incorporated herein by reference in its entirety. Use of the CN9014 and CN9018 oligomers, to the inventors' knowledge, have not previously been used as dielectric elastomers. All three of the above elastomer oligomers are acrylic acid based. CN9014 incorporates a polybutadiene additive, which results in a relatively stiffer elastomer. CN9018 incorporates a urethane additive, which results in a relatively softer elastomer. In some embodiments, a silicone additive may additionally or alternatively be employed to tune the behavior of the resulting elastomer. Further details concerning these various compositions are provided below.

In some embodiments, a layer of conductive particles may be disposed on a dielectric elastomer layer (e.g., an acrylic elastomer layer, such as those described above) so as to form a percolative electrode through which a subsequently introduced liquid elastomer may permeate and contact portions of the underlying dielectric elastomer layer. The liquid elastomer may then be cured (e.g., UV cured) to form an overlying dielectric elastomer layer. This process may then be repeated multiple times to form a multi-layer dielectric elastomer device having tens, hundreds, or even thousands of layers. In some implementations, the conductive particles may include conductive fibers such as silver nanowires or carbon nanotubes. The use of conductive fibers, in particular, can provide for significantly higher energy density than the relatively thicker electrodes used in prior designs. Moreover, when UV curing, rather than thermal curing, is employed to cure the elastomer layers, the per-layer processing rate can be ten to hundreds of times faster than prior approaches.

Figure 2A:
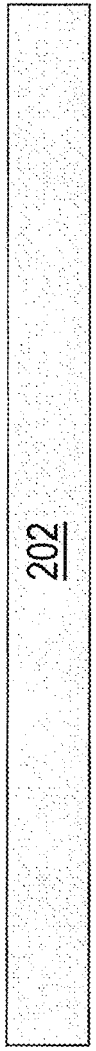
FIG. 2a is a diagram illustrating one step of an example fabrication method for a dielectric elastomer device.

FIGS. 2a-2e illustrate an example method for forming a portion of a multi-layer dielectric elastomer actuator or sensor in accordance with some embodiments. An initial elastomer layer 202 is illustrated in FIG. 2a. The elastomer layer 202 may be formed in any of numerous ways. In some embodiments, for example, the elastomer layer 202 may be formed by spin-coating a liquid elastomer precursor, e.g., one of the elastomer oligomers described above, optionally mixed with a cross-linking agent, e.g., HDDA (1,6-hexanediol diacrylate), onto a substrate, e.g., a polyethylene terephthalate glycol-modified (PETG) substrate, and then irradiating the liquid elastomer with UV radiation until it is fully or at least partially cured.

Figure 2B:
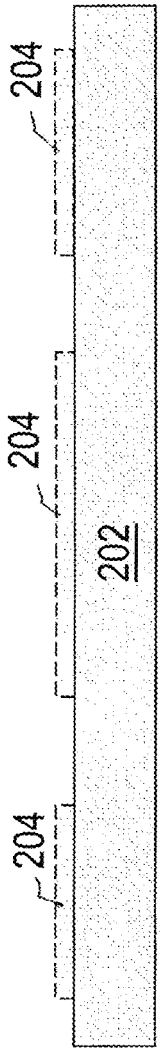
FIG. 2b is a diagram illustrating another step of an example fabrication method for a dielectric elastomer device.

Next, as shown in FIG. 2b, conductive particles may be transferred onto the upper surface of the elastomer layer 202 to form electrodes 204. The conductive particles may take on any of numerous forms, and may be transferred to the elastomer layer 202 in any of several ways. In some embodiments, for example, the electrodes 204 may be made by preparing a dry matte of single wall carbon nanotubes (SWCNTs) by filtration onto a polytetrafluoroethylene (PTFE) membrane, and directly transferring the SWCNTs from the PTFE membrane onto appropriate regions of the surface of the elastomer layer 202 via a mask (not shown). The mask may be applied to the upper surface of the elastomer layer 202 prior to transferring conductive particles to the elastomer layer 202, or may alternatively may be applied together with the transferring membrane. Other particle application techniques, such as spray-coating the particles on unmasked regions of the surface of the elastomer layer 202, may alternatively be employed to transfer conductive particles onto the upper surface of the elastomer layer 202 to form the electrodes 204.

A suitable mask may, for example, be laser cut from Mylar and coated with silicone to minimize adhesion to the upper surface of the elastomer layer 202. After the conductive particles have been transferred onto the upper surface of the elastomer layer 202, the mask may be removed, so that only the conductive particles forming the electrodes 204 remain on the surface, as seen in FIG. 2b. The mask may thus be configured to allow the transfer of electrodes 204 of virtually any size or shape onto the upper surface of the elastomer layer 202. As explained in more detail below, by appropriately controlling the shape and/or placement of the electrodes 204, as well as the manner in which electrodes on various layers are interconnected with electrodes on other layers, sophisticated and robust actuators and/or sensors can be created.

Figure 2C:
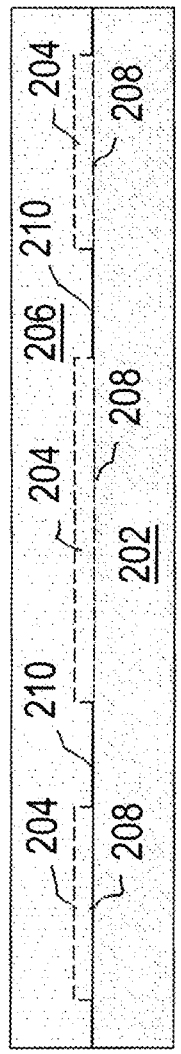
FIG. 2c is a diagram illustrating another step of an example fabrication method for a dielectric elastomer device.

Next, as illustrated in FIG. 2c, a liquid elastomer 206 may be disposed over the electrodes 204 and the elastomer layer 202 to form an overlaying liquid elastomer layer. In some embodiments, the liquid elastomer 206 may be the same liquid elastomer composition used to form the elastomer layer 202. In other embodiments, however, different precursors and/or cross-linking agents, and/or different ratios of the same, may be employed for each of the elastomer layers. In some embodiments, the liquid elastomer 206 may be spin-coated onto the elastomer layer 202 and electrodes 204 to form the liquid elastomer layer, but other application techniques, such as dip-coating, may alternatively be employed for this purpose.

Figure 2D:
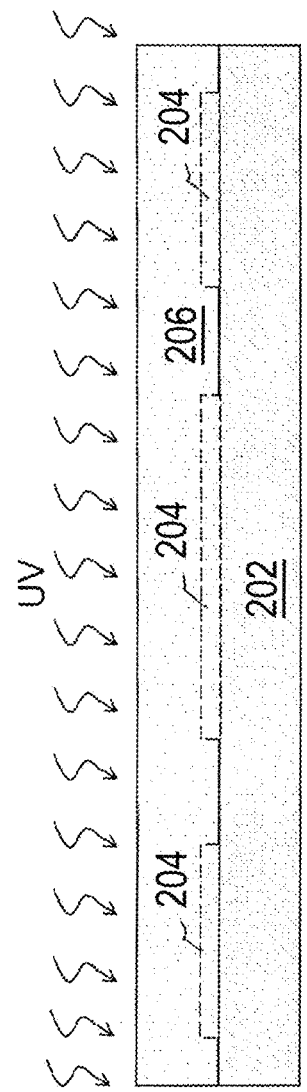
FIG. 2d is a diagram illustrating another step of an example fabrication method for a dielectric elastomer device.

Next, as shown in FIG. 2d, the liquid elastomer 206 may be cured, for example, by irradiating the liquid elastomer with UV radiation. Other polymer curing techniques, e.g., thermal curing, may alternatively be employed in some embodiments. As noted above, however, the use of UV curing can, at least in some circumstances, enable significantly faster per-layer processing times than other techniques, such as thermal curing. When percolative electrodes, such as those formed with carbon nanotubes, are employed as electrodes 204, the liquid elastomer 206 is allowed to permeate through the electrodes 204 and contact portions 208 of the elastomer layer 202 underneath the electrodes 204, in addition to portions 210 of the elastomer layer 202 that are not covered by the electrodes 204.

Figure 2E:
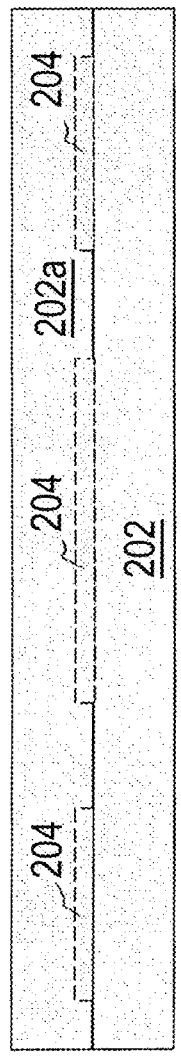
FIG. 2e is a diagram illustrating another step of an example fabrication method for a dielectric elastomer device.

As shown in FIG. 2e, upon curing, the applied liquid elastomer 206 becomes polymerized to form elastomer layer 202a. When percolative electrodes 204 are employed, because the liquid elastomer 206 is allowed to penetrate the electrodes and contact underlying portions elastomer layer 202, the elastomer layer 202a is polymerized both with the portions 210 of the underlying elastomer layer 202 that are not covered with the electrodes 204 and with the portions 208 of the elastomer layer that are covered by the electrodes 204. This high level of polymerization between elastomer layer 202a and elastomer layer 202 may significantly reduce the risk of delamination between layers of a multi-layer device.

The process of FIGS. 2a-e may repeated multiple times to build multiple additional layers of electrodes 204 interleaved with elastomer layers, with the newly-formed elastomer layer 202a corresponding to the base elastomer layer 202 of FIGS. 2a-e in each subsequent iteration. Stacks of tens, hundreds, or even thousands of elastomer layers and associated electrodes can be built using this technique.

In some embodiments, the electrodes 204 can be disposed at different locations on different ones of the elastomer layers 202, 202a. This can be accomplished, for example, by using different masks during the electrode transfer step (see FIG. 2b) employed for the respective layers. In some embodiments, for example, it may be advantageous to stagger the electrodes on every other level to enable every other electrode 204 to be connected to a different conductor, e.g., a conductor used to apply a voltage or a conductor used to apply a ground.

Figures 3A, 3B, 3C:
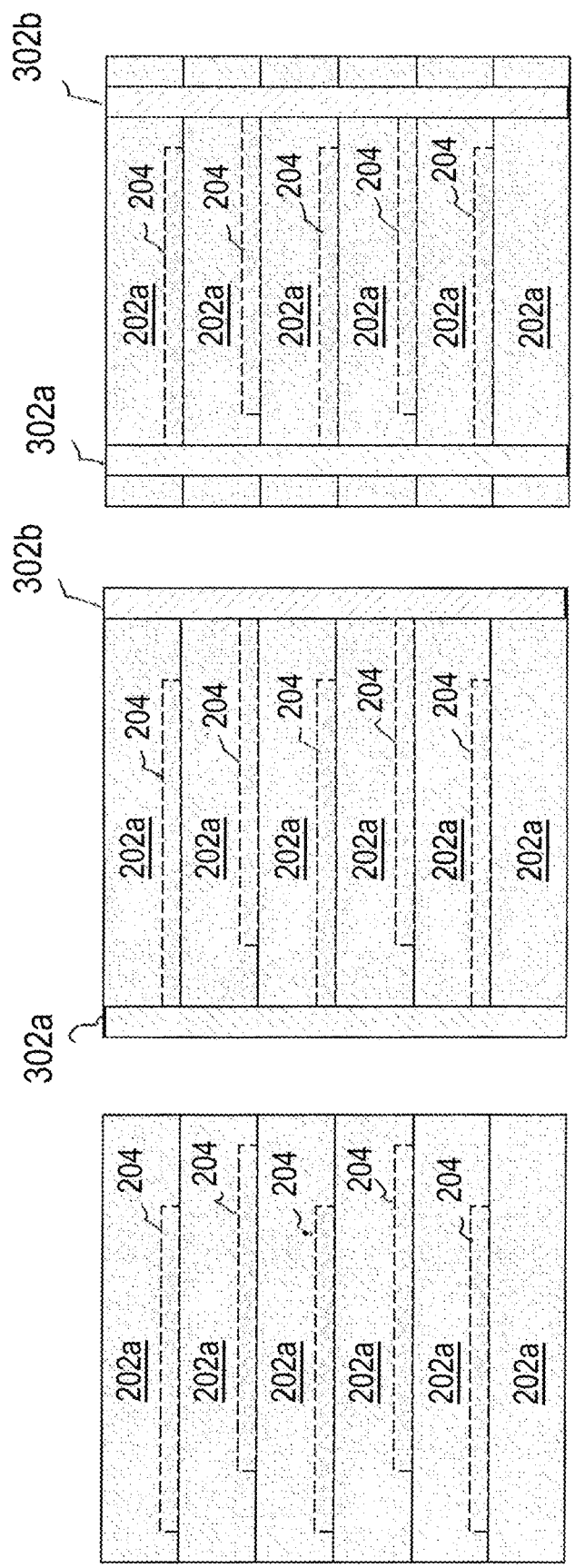
FIG. 3a is a diagram illustrating a staggered electrode configuration in a dielectric elastomer device.
FIG. 3b is a diagram illustrating how electrodes can extend along the sides of elastomer layers of a dielectric elastomer device.
FIG. 3c is a diagram illustrating how electrodes can pass through inner sections of elastomer layers of a dielectric elastomer device.

An example of such a staggered electrode configuration is shown in FIG. 3a. As shown in FIGS. 3b and 3c, respective conductors 302a, 302b can each interconnect a different set of electrodes 204 on every other layer. As shown in FIG. 3b, the conductors 302a, 302b can, in some embodiments, extend along the sides of the elastomer layers 202, 202a. As shown in FIG. 3c, the conductors 302a, 302b can alternatively extend through inner sections of the elastomer layers 202, 202a, e.g., passing through grooves or vias in the elastomer layers 202, 202a. In some embodiments, it may be advantageous to mechanically form the grooves or vias, e.g., by blade cutting or drilling, rather than using a laser, to maximize the integrity of the electrical connection between the conductors 302 and the electrodes 204.

Additionally or alternatively, in some embodiments, the conductors 302 may be formed so as to have a minimal impact on the Young's modulus of the multi-layer composite of elastomer layers 202, 202a and conductors 204. For example, by forming the conductors 302 with a conformable conductive material, such as colloidal silver or stretchable carbon tape, the Young's modulus of the composite can be increased by less than two times upon introduction of the conductors 302. In some embodiments, for example, liquid colloidal silver can be introduced into grooves or vias extending through the composite, and allowed to solidify to form the conductors 302 within such grooves or vias. In some embodiments, the size and scale of conductive particles used for the conductors 302 is substantially the same as that of the conductive particles used for the electrodes 204. In some embodiments, for example, the conductive particles used for the conductors 302 and the conductive particles used for the electrodes 204 are within an order of magnitude in average size. In such embodiments, if the average size of the particles used for the electrodes 204 is "1" micron, for example, then the average size of the particles used for the conductors 302 would be between "0.1" microns and "10" microns.

Figure 4:
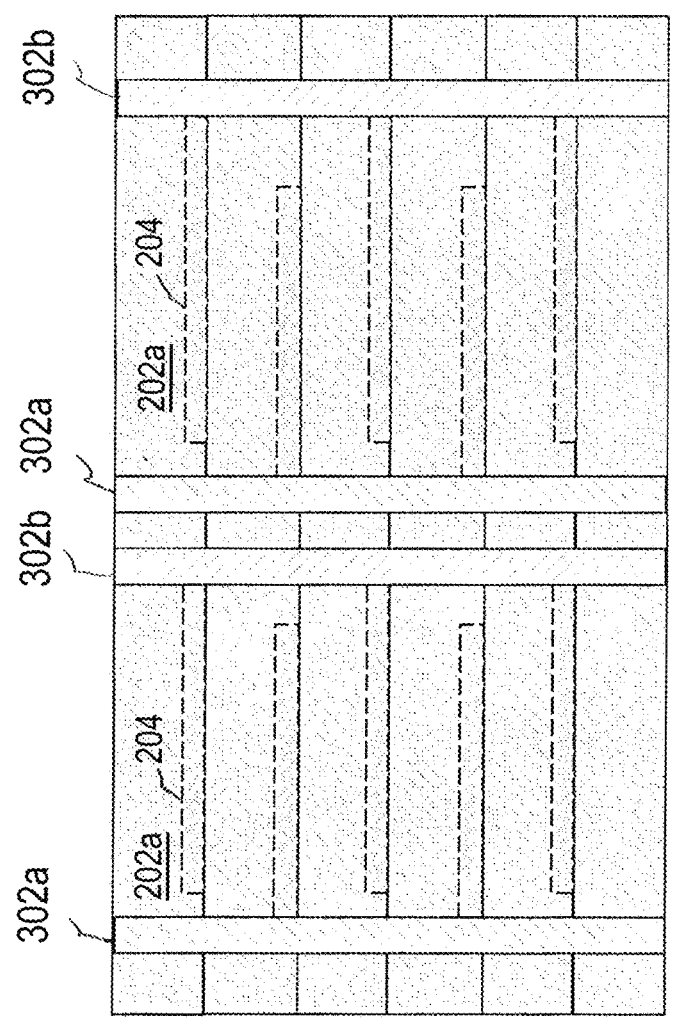
FIG. 4 is a diagram illustrating how different pairs of conductors can be used to interconnect different sets of electrodes in a dielectric elastomer device.

Additionally or alternatively, as shown in FIG. 4, in some embodiments, different pairs of conductors, e.g., conductor pair 302a and 302b and conductor pair 302c and 302d, can be used to interconnect different sets of electrodes 204. In such implementations, driving the different conductor pairs with different drive voltages can cause the composite to experience complex movements, thus enabling the formation of sophisticated multi-morph actuators to perform various functions.

Figure 5:
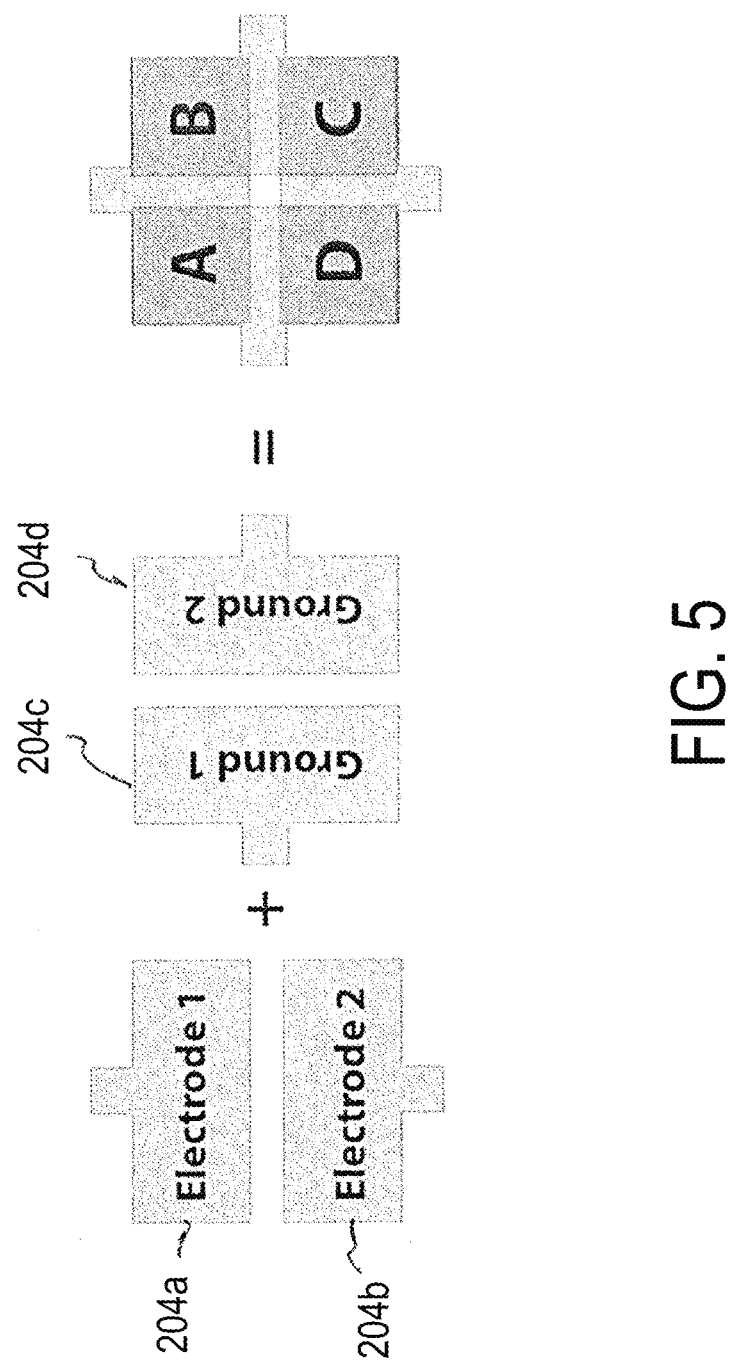
FIG. 5 is a diagram illustrating how the electrodes of a dielectric elastomer device can be oriented differently on different layers.

Additionally or alternatively, in some embodiments, the electrodes 204 of a multi-morph device can be oriented differently on different layers. FIG. 5 shows an example of how various electrodes 204a-d may be oriented when a dielectric elastomer actuator having such a configuration is viewed from above. In the example shown, for instance, the electrodes 204a, 204b for receiving drive voltages are oriented in a horizontal direction on one or more layers and the electrodes 204c, 204d are oriented in a vertical direction on one or more different layers. For example, in a multi-layer dielectric elastomer actuator, driving electrodes 204a, 204b having the shape and configuration shown in FIG. 5 may appear on even numbered layers and ground electrodes 204c, 204d having the shape and orientation shown may appear on odd numbered layers. By applying voltages between selected pairs or groups of the electrodes 204a-d, different deformations of the actuator can be achieved. For instance, applying a voltage between driving electrode 204a and ground electrode 204c can cause deformation of region "A" of the illustrated device, or applying a voltage between both driving electrodes 204a, 204b and the ground electrode 204c can cause deformation of both region "A" and region "D." In some embodiments, passive materials, e.g., Mylar sheets, can be added to portions of the actuator to alter the type of deformation that is experienced.

Figure 6:
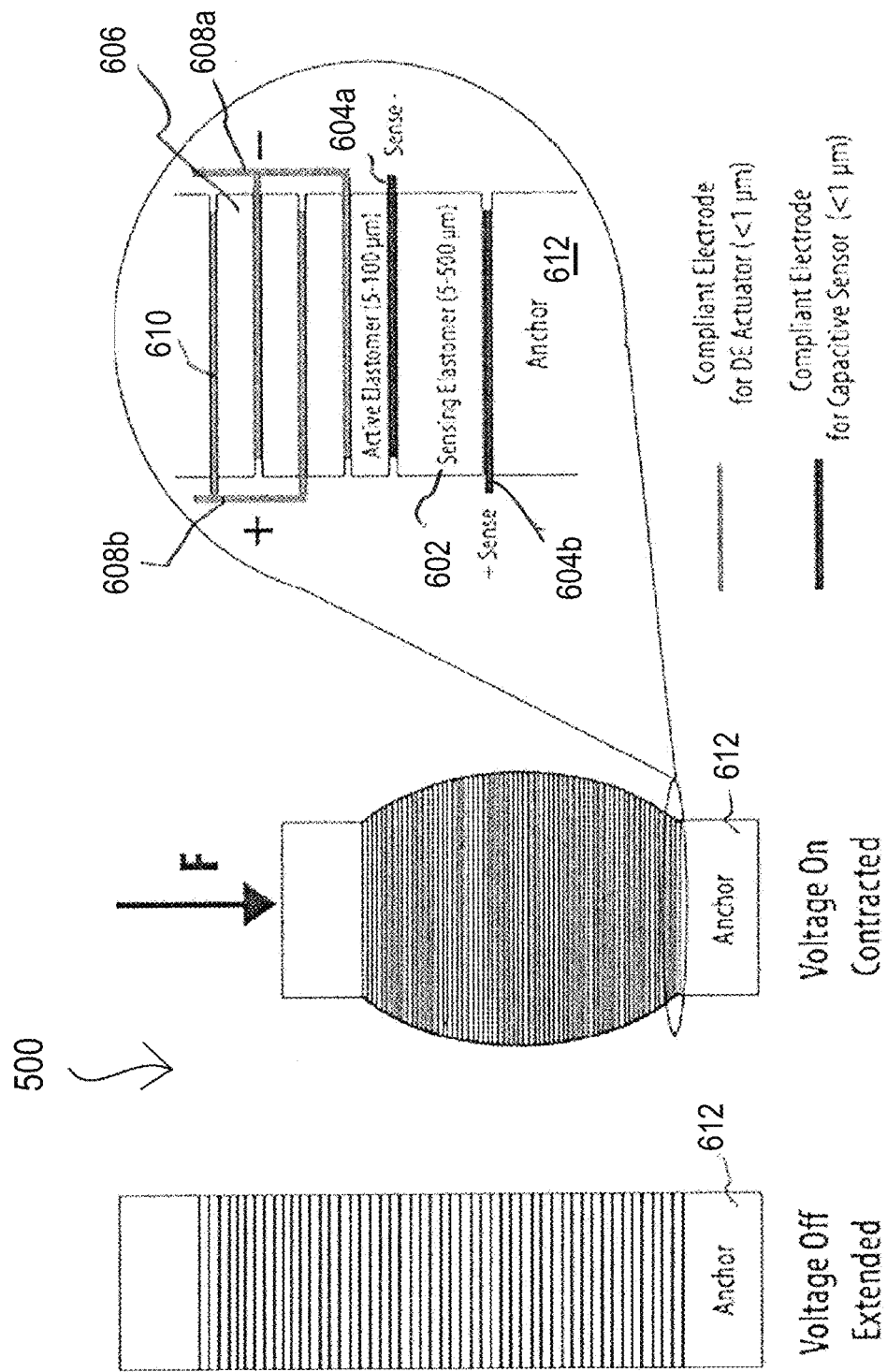
FIG. 6 shows an example of a dielectric elastomer device that includes different layers that serve different functions.

Additionally or alternatively, in some embodiments, different elastomer layers 202, 202a of a device may have different thicknesses and/or serve different functions than other layers. For example, some layers may be configured for use as a sensor, other layers may be configured for use as an actuator, and yet even other layers may be configured for use as an electro-adhesive. FIG. 6 illustrates an example of a dielectric elastomer device 500 that includes different layers that serve different functions. As seen, the device 500 includes a single, relatively thick dielectric elastomer layer 602 and a pair of compliant electrodes 604a, 604b that serve as a capacitive sensor. The remainder of the dielectric elastomer layers 606 (which in the example shown are quite numerous) are thinner than the layer 602 and, together with associated compliant electrodes 610, serve as a dielectric elastomer actuator. As shown, every other one of the compliant electrodes 610 may be connected to a ground conductor 608a and the remainder of the compliant electrodes 610 may be connected to a driving conductor 608b. As illustrated in FIG. 6, application of a driving voltage between the electrodes 608a and 608b causes the device to contract relative to an anchor 612.

Example Embodiments

The following are illustrative embodiments of inventive aspects of the present disclosure.

(A1) A method of making a dielectric elastomer device, comprising:

depositing conductive particles on a first dielectric elastomer layer to form a first electrode of the device;

applying a liquid elastomer over the conductive particles and the first dielectric elastomer layer so that the liquid elastomer covers the conductive particles and contacts portions of the first dielectric elastomer layer; and at least partially curing the liquid elastomer to form a second dielectric elastomer layer that is directly bonded with the contacted portions of the first dielectric elastomer layer.

(A2) The method of (A1), wherein the second dielectric elastomer layer is polymerized with the contacted portions of the first dielectric elastomer layer when the applied liquid elastomer is at least partially cured.

(A3) The method of (A1) or (A2), wherein the first dielectric elastomer layer and the liquid elastomer each comprises an acrylic elastomer.

(A4) The method of (A1) or (A2), wherein the first dielectric elastomer layer and the liquid elastomer each comprises a silicone elastomer.

(A5) The method of (A1) or (A2), wherein the first dielectric elastomer layer and the liquid elastomer each comprises a urethane elastomer.

(A6) The method of any of (A1)-(A5), wherein the conductive particles comprise nanoscale conductors.

(A7) The method of any of (A1)-(A6), wherein the conductive particles comprise conductive fibers.

(A8) The method of (A7), wherein the conductive fibers comprise carbon nanotubes.

(A9) The method of (A7) or (A8), wherein the conductive fibers comprise silver nanowires.

(A10) The method of any of (A1)-(A9), wherein the conductive particles comprise graphene.

(A11) The method of any of (A1)-(A10), further comprising:
depositing additional conductive particles on the second dielectric elastomer layer to form a second electrode of the device;
applying an additional liquid elastomer over the additional conductive particles and the second dielectric elastomer layer so that the additional liquid elastomer covers the additional conductive particles and contacts portions of the second dielectric elastomer layer; and
at least partially curing the additional liquid elastomer to form a third dielectric elastomer layer that is directly bonded with the contacted portions of the second dielectric elastomer layer.

(A12) The method of any of (A1)-(A11), wherein the device comprises a dielectric elastomer actuator or sensor.

(B1) A dielectric elastomer device, comprising:
at least first and second dielectric elastomer layers; and
a first layer of conductive particles disposed between the first and second dielectric elastomer layers and forming a first electrode of the device;
wherein portions of the second dielectric elastomer layer are directly bonded with portions of the first dielectric elastomer layer through the first layer of the conductive particles.

(B2) The device of (B1), wherein the portions of the second dielectric elastomer layer are polymerized with the portions of the first dielectric elastomer layer through the first layer of conductive particles.

(B3) The device of (B1) or (B2), wherein the first and second dielectric elastomer layers each comprises an acrylic elastomer.

(B4) The device of (B1) or (B2), wherein the first and second dielectric elastomer layers each comprises a silicone elastomer.

(B5) The device of (B1) or (B2), wherein the first and second dielectric elastomer layers each comprises a urethane elastomer.

(B6) The device of any of (B1)-(B5), wherein the conductive particles comprise nanoscale conductors.

(B7) The device of any of (B1)-(B6), wherein the conductive particles comprise conductive fibers.

(B8) The device of (B7), wherein the conductive fibers comprise carbon nanotubes.

(B9) The device of (B7) or (B8), wherein the conductive fibers comprise silver nanowires.

(B10) The device of any of (B1)-(B9), wherein the conductive particles comprise graphene.

(B11) The device of any of (B1)-(B10), further comprising:
a third dielectric elastomer layer; and
a second layer of the conductive particles disposed between the second and third elastomer layers and forming a second electrode of the device;
wherein portions of the third elastomer layer are directly bonded with portions of the second elastomer layer through the second layer of the conductive particles.

(B12) The device of any of (B1)-(B11), wherein the device comprises a dielectric elastomer actuator or sensor.

(C1) A method of making a dielectric elastomer device, comprising:
at least partially curing a liquid elastomer to form a dielectric elastomer layer; and
depositing an electrode on the dielectric elastomer layer;
wherein the liquid elastomer comprises an acrylic elastomer precursor with an additive including urethane, polybutadiene, or silicone.

(C2) The method of (C1), wherein the additive includes urethane.

(C3) The method of (C1), wherein the additive includes polybutadiene.

(C4) The method of (C1), wherein the additive includes silicone.

(C5) The method of any of (C1)-(C4), wherein the acrylic elastomer precursor comprises a difunctional acrylic ester resin.

(C6) The method of any of (C1)-(C5), wherein the electrode comprises conductive particles.

(C7) The method of (C6), wherein the conductive particles comprise nanoscale conductors.

(C8) The method of (C6) or (C7), wherein the conductive particles comprise conductive fibers.

(C9) The method of (C8), wherein the conductive fibers comprise carbon nanotubes.

(C10) The method of (C8) or (C9), wherein the conductive fibers comprise silver nanowires.

(C11) The method of any of (C1)-(C10), wherein the electrode comprises graphene.

(C12) The method of any of (C1)-(C11), wherein the device comprises a dielectric elastomer actuator, sensor, or electro-adhesive.

(D1) A dielectric elastomer device, comprising:
a dielectric elastomer layer; and
an electrode disposed on the dielectric elastomer layer;
wherein the dielectric elastomer layer comprises a cured acrylic elastomer precursor with an additive including urethane, polybutadiene, or silicone.

(D2) The method of (D1), wherein the additive includes urethane.

(D3) The method of (D1), wherein the additive includes polybutadiene.

(D4) The method of (D1), wherein the additive includes silicone.

(D5) The device of any of (D1)-(D4), wherein the acrylic elastomer precursor comprises a difunctional acrylic ester resin.

(D6) The device of any of (D1)-(D5), wherein the electrode comprises conductive particles.

(D7) The device of any of (D6), wherein the conductive particles comprise nanoscale conductors.

(D8) The device of (D6) or (D7), wherein the conductive particles comprise conductive fibers.

(D9) The device of (D8), wherein the conductive fibers comprise carbon nanotubes.

(D10) The device of (D8) or (D9), wherein the conductive fibers comprise silver nanowires.

(D11) The device of any of (D1)-(D10), wherein the electrode comprises graphene.

(D12) The device of any of (D1)-(D11), wherein the device comprises a dielectric elastomer actuator, sensor, or electro-adhesive.

(E1) A method of interconnecting electrodes in different layers of a multi-layer dielectric elastomer actuator or sensor device, comprising:
infusing a liquid or semi-liquid conductive material in contact with each of a plurality of the electrodes of the actuator or sensor device; and
solidifying the conductive material to form a conductive path that interconnects the plurality of electrodes.

(E2) The method of (E1), wherein the device comprises a plurality of acrylic elastomer layers.

(E3) The method of (E1), wherein the device comprises a plurality of silicone elastomer layers.

(E4) The method of (E1), wherein the device comprises a plurality of urethane elastomer layers.

(E5) The method of any of (E1)-(E4), wherein each of the plurality of electrodes comprises conductive particles.

(E6) The method of (E5), wherein:
the liquid or semi-liquid conductive material comprises suspended conductive particles; and
the suspended conductive particles in the liquid or semi-liquid conductive material and the conductive particles of the plurality of electrodes are within an order of magnitude in average size.

(E7) The method of (E5) or (E6), wherein the conductive particles of the plurality of electrodes comprise nano scale conductors.

(E8) The method of any of (E5)-(E7), wherein the conductive particles of the plurality of electrodes comprise conductive fibers.

(E9) The method of (E8), wherein the conductive fibers comprise carbon nanotubes.

(E10) The method of (E8) or (E9), wherein the conductive fibers comprise silver nanowires.

(E11) The method of any of (E1)-(E10), wherein each of the plurality of electrodes comprises graphene.

(E12) The method of any of (E1)-(E5) and (E7)-(E11), wherein the liquid or semi-liquid conductive material comprises suspended conductive particles.

(F1) A multi-layer dielectric elastomer actuator or sensor device, comprising:
a plurality of dielectric elastomer layers interleaved with conductive layers that form a plurality of electrodes on different layers of the actuator or sensor device; and
conductive particles forming a conductive path that interconnects the plurality of electrodes.

(F2) The device of (F1), wherein the device comprises a plurality of acrylic elastomer layers.

(F3) The device of (F1), wherein the device comprises a plurality of silicone elastomer layers.

(F4) The device of (F1), wherein the device comprises a plurality of urethane elastomer layers.

(F5) The device of any of (F1)-F4), wherein each of the plurality of electrodes comprises conductive particles.

(F6) The device of (F5), wherein the conductive particles forming the conductive path and the conductive particles of the plurality of electrodes are within an order of magnitude in average size.

(F7) The device of (F5) or (F6), wherein the conductive particles of the plurality of electrodes comprise nano scale conductors.

(F8) The device of any of (F5)-(F7), wherein the conductive particles of the plurality of electrodes comprise conductive fibers.

(F9) The device of (F8), wherein the conductive fibers comprise carbon nanotubes.

(F10) The device of (F8) or (F9), wherein the conductive fibers comprise silver nanowires.

(F11) The device of any of (F1)-(F10), wherein each of the plurality of electrodes comprises graphene.

(G1) A method making a multi-layer elastomer actuator or sensor device, comprising:
forming a composite having a plurality of dielectric elastomer layers interleaved with conductive layers forming electrodes of the actuator or sensor device; and
using a conformable conductive material to establish a conductive path between at least two of the conductive layers without increasing the Young's modulus of the composite by more than 2×.

(G2) The method of (G1), wherein each of the plurality of dielectric elastomer layers comprises an acrylic elastomer layer.

(G3) The method of (G1), wherein each of the plurality of dielectric elastomer layers comprises an acrylic silicone layer.

(G4) The method of (G1), wherein each of the plurality of dielectric elastomer layers comprises an acrylic urethane layer.

(G5) The method of any of (G1)-(G4), wherein each of the conductive layers comprises conductive particles.

(G6) The method of (G5), wherein the conductive particles comprise nanoscale conductors.

(G7) The method of (G5) or (G6), wherein the conductive particles comprise conductive fibers.

(G8) The method of (G7), wherein the conductive fibers comprise carbon nanotubes.

(G9) The method of (G7) or (G8), wherein the conductive fibers comprise silver nanowires.

(G10) The method of any of (G1)-(G9), wherein each of the conductive layers comprises graphene (H1) A multi-layer dielectric elastomer actuator or sensor device, comprising:
a composite having a plurality of dielectric elastomer layers interleaved with conductive layers forming electrodes of the actuator or sensor device; and
a conformable conductive material electrically interconnecting at least two of the conductive layers without increasing the Young's modulus of the composite by more than 2×.

(H2) The device of (H1), wherein each of the plurality of dielectric elastomer layers comprises an acrylic elastomer layer.

(H3) The device of (H1), wherein each of the plurality of dielectric elastomer layers comprises an acrylic silicone layer.

(H4) The device of (H1), wherein each of the plurality of dielectric elastomer layers comprises an acrylic urethane layer.

(H5) The device of any of (H1)-(H4), wherein each of the conductive layers comprises conductive particles.

(H6) The device of (H5), wherein the conductive particles comprise nanoscale conductors.

(H7) The device of (H5) or (H6), wherein the conductive particles comprise conductive fibers.

(H8) The device of (H7), wherein the conductive fibers comprise carbon nanotubes.

(H9) The device of (H7) or (H8), wherein the conductive fibers comprise silver nanowires.

(H10) The device of any of (H1)-(H9), wherein each of the conductive layers comprises graphene.

(I1) A method of making a dielectric elastomer actuator or sensor device, comprising:

depositing a conductive layer on a dielectric elastomer layer such that the conductive layer comprises at least first and second electrically isolated conductive regions that form electrodes for respective actuator or sensor regions of the device.

(I2) The method of (I1), wherein the dielectric elastomer layer comprises an acrylic elastomer layer.

(I3) The method of (I1), wherein the dielectric elastomer layer comprises an acrylic silicone layer.

(I4) The method of (I1), wherein the dielectric elastomer layer comprises an acrylic urethane layer.

(I5) The method of any of (I1)-(I4), wherein the conductive layer comprises conductive particles.

(I6) The method of (I5), wherein the conductive particles comprise nanoscale conductors.

(I7) The method of (I5) or (I6), wherein the conductive particles comprise conductive fibers.

(I8) The method of (I7), wherein the conductive fibers comprise carbon nanotubes.

(I9) The method of (I7) or (I8), wherein the conductive fibers comprise silver nanowires.

(I10) The method of any of (I1)-(I9), wherein the conductive layer comprises graphene.

(J1) A dielectric elastomer actuator or sensor device, comprising:

a dielectric elastomer layer; and a conductive layer deposited on the dielectric elastomer layer, the conductive layer comprising at least first and second electrically isolated conductive regions that form electrodes for respective actuator or sensor regions of the device.

(J2) The device of (J1), wherein the dielectric elastomer layer comprises an acrylic elastomer layer.

(J3) The device of (J1), wherein the dielectric elastomer layer comprises an acrylic silicone layer.

(J4) The device of (J1, wherein the dielectric elastomer layer comprises an acrylic urethane layer.

(J5) The device of any of (J1)-(J4), wherein the conductive layer comprises conductive particles.

(J6) The device of (J5), wherein the conductive particles comprise nanoscale conductors.

(J7) The device of (J5) or (J6), wherein the conductive particles comprise conductive fibers.

(J8) The device of (J7), wherein the conductive fibers comprise carbon nanotubes.

(J9) The device of (J7) or (J8), wherein the conductive fibers comprise silver nanowires.

(J10) The device of any of (J1)-(J9), wherein the conductive layer comprises graphene.

(K1) A method of making a multi-layer dielectric elastomer device, comprising:

forming a composite having a plurality of dielectric elastomer layers interleaved with conductive layers;

connecting at least two first portions of the conductive layers to first circuitry that is configured to operate a first region of the device as a first actuator, sensor, or electro-adhesive; and connecting at least two second portions of the conductive layers to second circuitry that is configured to operate a second region of the device as a second actuator, sensor, or electro-adhesive.

(K2) The method of (K1), wherein each of the plurality of dielectric elastomer layers comprises an acrylic elastomer layer.

(K3) The method of (K1), wherein each of the plurality of dielectric elastomer layers comprises an acrylic silicone layer.

(K4) The method of (K1), wherein each of the plurality of dielectric elastomer layers comprises an acrylic urethane layer.

(K5) The method of any of (K1)-(K4), wherein each of the conductive layers comprises conductive particles.

(K6) The method of (K5), wherein the conductive particles comprise nanoscale conductors.

(K7) The method of (K5) or (K6), wherein the conductive particles comprise conductive fibers.

(K8) The method of (K7), wherein the conductive fibers comprise carbon nanotubes.

(K9) The method of (K7) or (K8), wherein the conductive fibers comprise silver nanowires.

(K10) The method of any of (K1)-(K9), wherein each of the conductive layers comprises graphene.

(K11) The method of any of (K1)-(K10), wherein:

the first circuitry is configured to operate the first region of the device as a first actuator; and the second circuitry is configured to operate the second region of the device as a second actuator.

(K12) The method of any of (K1)-(K10), wherein:

the first circuitry is configured to operate the first region of the device as an actuator; and the second circuitry is configured to operate the second region of the device as a sensor.

(L1) A multi-layer dielectric elastomer device, comprising:

a plurality of dielectric elastomer layers interleaved with conductive layers; and circuitry configured to generate and/or sense voltage signals; wherein at least two first portions of the conductive layers are connected to the circuitry to operate a first region of the device as a first actuator, sensor, or electro-adhesive; and at least two second portions of the conductive layers are connected to the circuitry to operate a second region of the device as a second actuator, sensor, or electro-adhesive.

(L2) The device of (L1), wherein each of the plurality of dielectric elastomer layers comprises an acrylic elastomer layer.

(L3) The device of (L1), wherein each of the plurality of dielectric elastomer layers comprises an acrylic silicone layer.

(L4) The device of (L1), wherein each of the plurality of dielectric elastomer layers comprises an acrylic urethane layer.

(L5) The device of any of (L1)-(L4), wherein each of the conductive layers comprises conductive particles.

(L6) The device of (L5), wherein the conductive particles comprise nanoscale conductors.

(L7) The device of (L5) or (L6), wherein the conductive particles comprise conductive fibers.

(L8) The device of (L7), wherein the conductive fibers comprise carbon nanotubes.

(L9) The device of (L7) or (L8), wherein the conductive fibers comprise silver nanowires.

(L10) The device of any of (L1)-(L9), wherein each of the conductive layers comprises graphene.

(L11) The device of any of (L1)-(L10), wherein:
the circuitry is configured to operate the first region of the device as a first actuator and to operate the second region of the device as a second actuator.

(L12) The device of any of (L1)-(L10), wherein:
the circuitry is configured to operate the first region of the device as an actuator and to operate the second region of the device as a sensor.

Working Examples and Experimental Results

Set for the below are details of specific experiments that were conducted by the inventors and their analysis of the results of those experiments. The inventors started with an acrylic composition that can be spin-cast as a liquid, and then UV cured. The base acrylic composition was previously shown to be capable of actuation without pre-stretch. The inventors also introduced and evaluated various modifications to that base composition. The acrylic compositions tested were determined to have sufficient inherent adhesion that an ultrathin matte of SWCNTs can be transferred directly onto it through a mask to create compliant electrodes. A new elastomer layer was then be spun coat on top, UV cured, and the process repeated to create the desired number of multilayers.

Three different acrylic liquid oligomers were investigated: A (CN9021), B (CN9014) and C (CN9018). The first is the same as previously investigated in X. Niu, H. Stoyanov, W. Hu, R. Leo, P. Brochu, Q. Pei, Journal of Polymer Science Part B: Polymer Physics, 2013, 51, 3, whereas B and C had not, to the inventors' knowledge, previously been used as dielectric elastomers. It was determined that each of the oligomers can be cross-linked using 1,6-hexanediol diacrylate (HDDA) and can be UV cured. To demonstrate the viability of this approach, unimorphs were fabricated by building up the multilayers, then attaching a thin Mylar sheet, which serves as the passive layer. Evaluation of the unimorph characteristics as well as of the elastomers and the adhesive strength of the layers are described below. These include experiments of the unimorph frequency response demonstrating the bandwidth can be controlled by composition.

Strong adhesion between the elastomer and electrode layers can be important for multilayer device fabrication. All the formulations investigated, over a range of 0 to 15% by mass of 1,6-hexanediol diacrylate (HDDA) cross-linker, had sufficient adhesion to completely transfer SWCNT networks at concentrations as high as 22.5 mg/m².

Figure 7A:
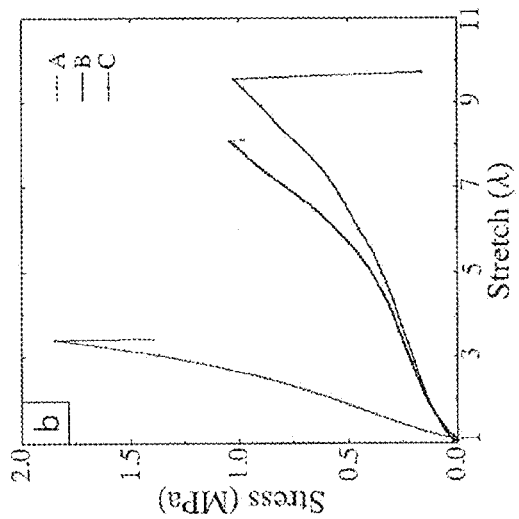
FIG. 7a is a graph showing the adhesive force required to separate a flat sheet of PTFE from a pristine layer of elastomer as a function of the type of pre-polymer and cross-linker concentration.

FIG. 7a illustrates the adhesive force required to separate a flat sheet of PTFE from a pristine layer of elastomer as a function of the type of pre-polymer and cross-linker concentration. As seen, the adhesion strength, quantified using a pull off test, was found to decrease slightly with cross-linker concentration. The most adhesive was elastomer A without any cross-linker. For this reason, it was used throughout this work as the base for building multilayers by spin coating on a polyethylene terephthalate glycol (PETG) support wafer.

Figure 7B:
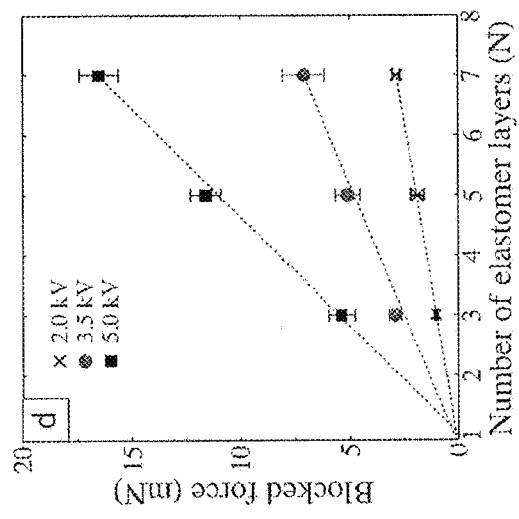
FIG. 7b is a graph showing stress vs. stretch curves for different elastomers without any HDDA cross-linker.
Figure 12:
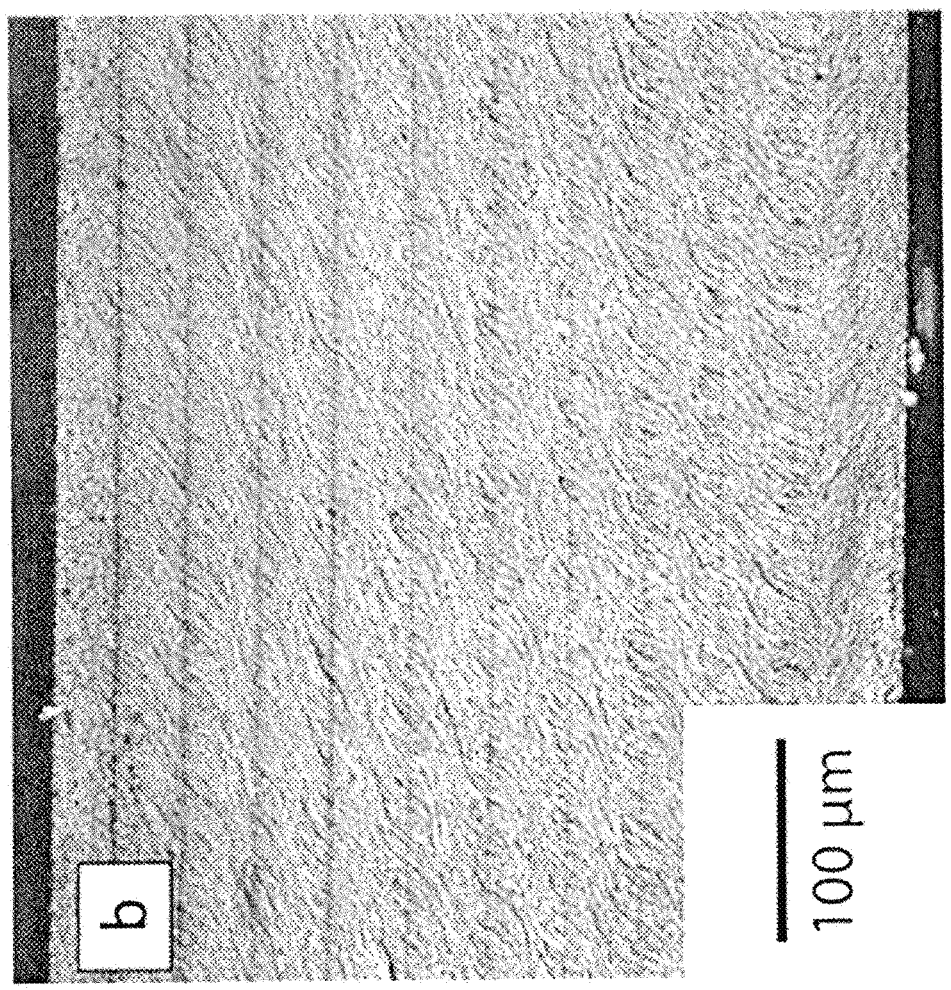
FIG. 12 shows a confocal microscopy image of the cross-section of a 12-layer stack made using elastomer B with 10% HDDA cross-linker.

FIG. 7b shows stress vs. stretch curves for different elastomers without any HDDA cross-linker. FIG. 12 shows a confocal microscopy image of the cross-section of a 12-layer stack made using elastomer B with 10% HDDA cross-linker. The fracture markings obscure some of the electrode layers. These cross-sections of the multilayers indicate that there was good layer uniformity. In this example the average layer thickness was 37.7±1.6 μm without SWCNT electrodes. The SWCNT electrodes were difficult to discern by confocal imaging making measurements of their thickness unreliable but they were estimated to be <100 nm thick. The presence of the SWCNT electrodes decreased the adhesive strength between the elastomer layers as the concentration of the SWCNT increased but no delamination was observed in any of the unimorph tests. Furthermore, the adhesive failure always occurred within the elastomer impregnated SWCNT layer, leaving SWCNT on both of the separated surfaces.

Figure 7C:
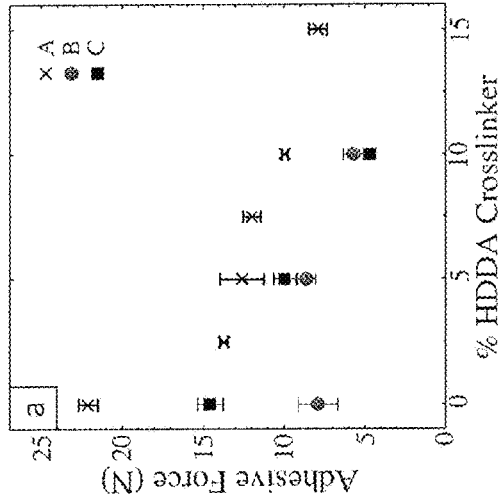
FIG. 7c is a graph showing stress vs. stretch curves for elastomer A with 10% cross-linker in three different configurations: single layer, six-layer multilayer, and six-layer multilayer with SWCNT embedded electrodes.

Tensile testing of the elastomers, shown in FIG. 7b, indicated that all of them had similar non-linear strain stiffening behavior. Elastomer B is significantly stiffer than either A or C, while C has higher elongation at failure than A. As expected, the effect of cross-linking is to increase the elastic modulus at the expense of the stretch to failure. FIG. 7c shows stress vs. stretch curves for elastomer A with 10% cross-linker in three different configurations: single layer, six-layer multilayer, and six-layer multilayer with SWCNT embedded electrodes. The thickness of each test sample was the same (~90 μm). The data clearly shows that the presence of the electrodes in these multilayers neither increases the stiffness of the multilayers nor affects the attainable stretch to failure.

As mentioned earlier, the work of Niu et al. showed that voltage controlled actuation of the elastomer A could be achieved without pre-stretching. The inventors found that all three of the elastomers studied also show actuation without pre-stretching.

To evaluate the actuation performance of the multilayers in a unimorph configuration, measurements were made of the blocked force, the free-end displacement and the actuator bandwidth of unimorphs all having the same dimensions (20 mm long and 5 mm wide). The energy density of the actuators was estimated as $$\frac{F_B \delta}{2m},$$

where $F_B$ is the blocked force, $\delta$ is the displacement and m is the mass of the actuator. Similarly, the power density was estimated as the product of the energy density and the actuator bandwidth. The three different elastomers with 10% cross-linker were each made into 12 layer unimorphs consisting of individual layers each approximately 30 μm thick. At low frequencies, the end displacement was independent of frequency but at higher frequencies, the peak-to-peak end displacement decreased. The frequency at which the peak-to-peak displacement decreased sharply with frequency was identified as the maximum bandwidth of the actuator. Elastomers made with elastomer A had the highest energy density, while B and C had significantly higher bandwidths, and therefore higher power densities.

The table below illustrates unimorph performance for devices built from 12 layers of elastomer of 40 microns each. The unimorph width was 5 mm and the length was 20 mm, weighing ~50 mg, while the actuation voltage was 4 kV. Three actuators were tested for each precursor type, all tests were performed five times. The fastest actuator in each configuration was used to determine the maximum bandwidth.

| Pre-cursor type | Blocked force [mN] | Maximum displacement [mm] | Maximum bandwidth [Hz] | Energy density [J/kg] | Maximum power density [W/kg] |
| --- | --- | --- | --- | --- | --- |
| A | 16.9 ± 1.0 | 12.0 ± 0.3 | 1 | 2.04 ± 0.12 | 2.04 ± 0.12 |
| B | 11.1 ± 0.6 | 12.6 ± 0.4 | 30 | 1.42 ± 0.08 | 42.6 ± 2.42 |
| C | 12.5 ± 0.9 | 15.6 ± 0.4 | 10 | 1.95 ± 0.10 | 19.5 ± 1.01 |

Figure 7D:
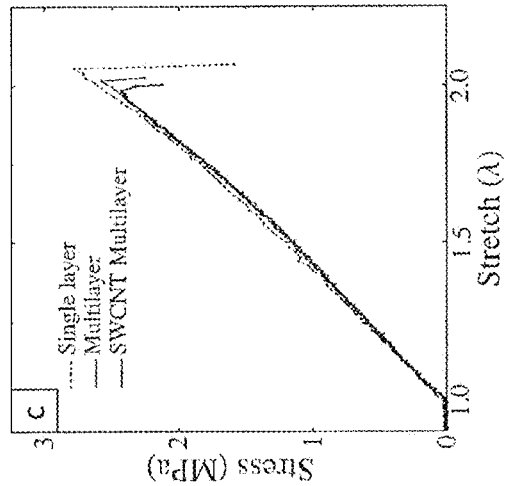
FIG. 7d is a graph illustrating blocked force as a function of number of elastomer layers of equal thickness (70 μm layers, elastomer A with 10% HDDA) at the three different voltages indicated.
Figure 8:
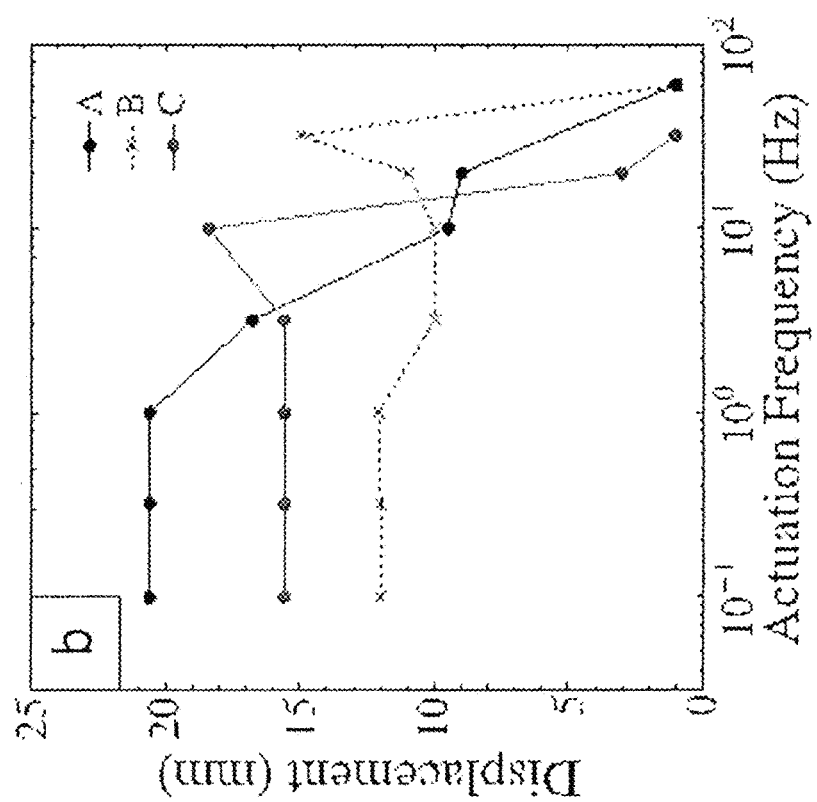
FIG. 8 is a graph illustrating the specific dependence of displacement on actuation frequency.

FIG. 8 illustrates the specific dependence of displacement on actuation frequency. From measurements of the electrical current during actuation, the time to charge each of the multilayers was found to be similar, being in the 1-10 ms range, suggesting that the bandwidth differences were due to different viscoelastic responses of the elastomers rather than being an electrical RC time constant. In addition, measurements of blocked force in three, five and seven layer unimorph actuators all showed a linear dependence of the force on the number of layers in the device (see FIG. 7d), consistent with simple mechanics models. In particular, FIG. 7d illustrates blocked force as a function of number of elastomer layers of equal thickness (70 µm layers, elastomer A with 10% HDDA) at the three different voltages indicated.

Figure 9:
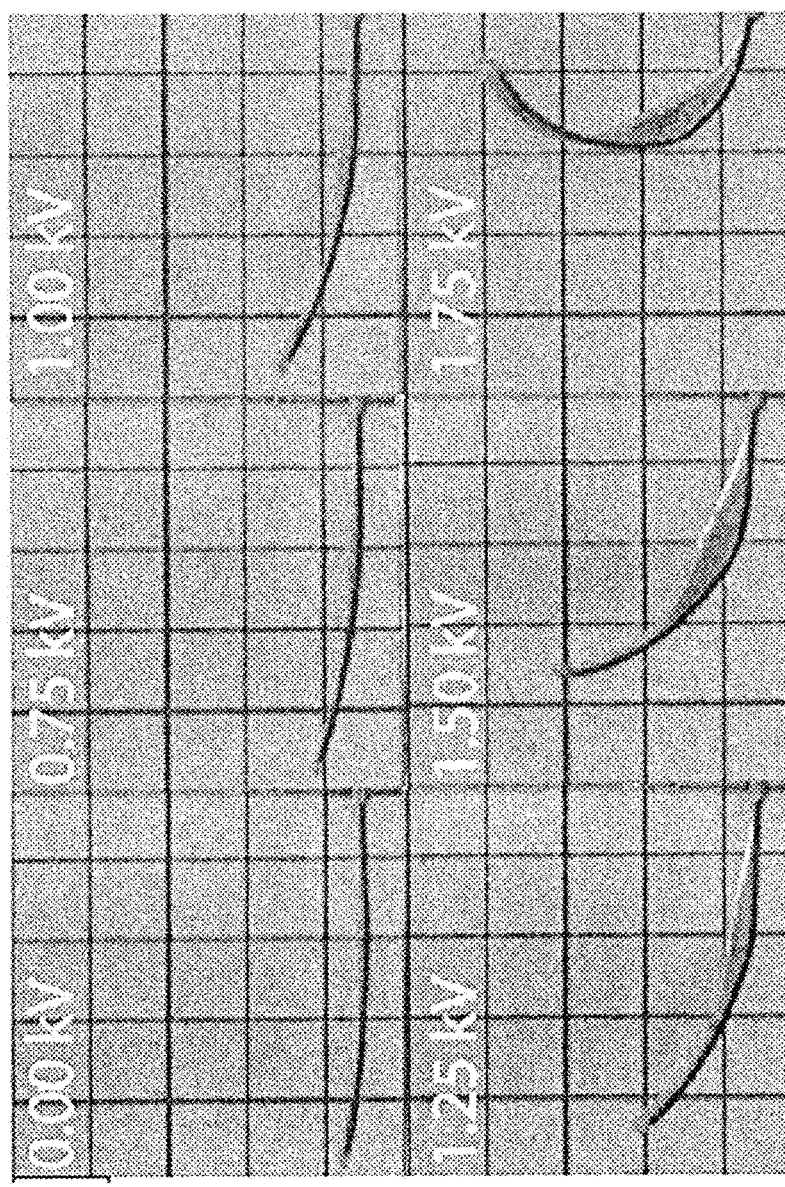
FIG. 9 shows images of a 12-layer elastomer A with 10% HDDA in a unimorph configuration at six different applied voltages.

The multilayer fabrication method was effective at lowering the actuation voltage. For example, a unimorph made with 25 µm single layers deformed significantly with voltages of 1-2 kV, a value at the low range of actuation voltages reported thus far. FIG. 9 shows images of a 12-layer elastomer A with 10% HDDA in a unimorph configuration at six different applied voltages. The grid spacing in the background is 5 mm. Occasionally, it was found that even lower actuation voltages (~600 V) could be obtained with thinner elastomers but this was not reproducible because of the unavoidable presence, at least in our experiments, of air borne particulates. Indeed, the total number of layers will be limited by the process tolerance to prevent defects in the elastomer, since dielectric breakdown in any one layer can lead to breakdown of the multi-layer device through an electrical short.

The fabrication method also enabled the inventors to devise more complex, and programmable, actuation actions into a single device. This is illustrated in FIG. 5 where, by varying the pattern of electrodes between different layers, the inventors were able to create a multi-morph actuator capable of nine different deformation modes when different electrodes were powered. The multiple degrees of freedom were built in by controlling the geometries and electrical connection paths of each of the four electrodes. While the multi-morph presented is relatively basic, the principle behind it can be used to create much more complex motion, beyond traditional DEA architectures.

The inventors also demonstrated that the performance of DEAs (maximum strain, energy density and actuator bandwidth) can be tuned by controlling both the choice of elastomer precursor and the cross-linker concentration. The cross-linking concentration increased the stiffness, reduced the maximum elongation before failure, and decreased the adhesive strength of the elastomers. The Young's modulus for elastomer B without any HDDA cross-linker (0.66 MPa) was almost an order or magnitude higher than elastomer A (0.1 MPa). Meanwhile, precursor C had similar stiffness, but slightly larger extension range, without being as adhesive. Between the three precursors and the ability to vary cross-linker density, the range of mechanical properties for acrylic elastomers that actuate without pre-stretch is greatly expanded. The unimorph actuator testing revealed that the novel oligomers, elastomers B and C, offered additional advantages over previous compositions. The increase in resonant frequency from 1 (for A) to 30 Hz (for B) confirmed that tailoring the material composition could overcome some of the known drawbacks of acrylic elastomers such as slow actuation speed. The energy densities were comparable to other multilayer geometries, but the power densities reported here broaden the range of potential applications.

The combination of liquid acrylic oligomers, UV curing and the intrinsic adhesiveness of the acrylics together with standard spin coating, patterning and dry transfer of SWCNT by stamping can be used to fabricate multilayer dielectric elastomer devices. The use of a liquid precursor that can be UV cured after each layer, enables thinner elastomer layers to be obtained, decreasing the voltage required for actuation. The thickness of the individual layers can be determined, for example, by control of the spin coating process and the viscosity of the liquid. Thinner SWCNT electrodes decrease the effective electrode stiffness that, in turn, increases the attainable actuation strain for a given applied voltage. The natural adhesion of the acrylics increases the reliability of the stamping of the SWCNT as well as adhesion to a wider range of substrate materials. Furthermore, the ability to create the electrodes by stamping (or spraying) facilitates patterning of the electrode geometries, including doing so at different positions in the multilayer structure.

A simple two-dimensional actuator was demonstrated illustrating the potential of electrode patterning. Overall the process can be tuned to fabricate versatile devices, in which the number, thickness, planar geometry, electrode coupling and chemical nature of the layers can be manipulated to design actuators for specific applications. The multi-morph actuator highlights a novel approach to creating smart programmable materials capable of multiple degrees of freedom from limited inputs. Beyond improving DEAs, the combination of acrylic elastomers and stretchable carbon nanotube network electrodes is a materials platform technology that can also be applied to other areas, such as stretchable sensors, soft sensor-actuator combinations, soft electro-adhesives to name a few.

Elastomer Formulations

The concentrations of each component used in the acrylic elastomer precursors discussed above, as well as their functionalities, are presented in the table below.

| Component/functionality | Abbreviation | Amount (by weight) |
| --- | --- | --- |
| Proprietary blend/elastomer oligomer | CN9014, CN9018 or CN9021 | 70% |
| Isododecyl acrylate/viscosity modifier | IDA | 22.5-X % |
| Isobornyl acrylate/toughness enhancer | IBOA | 5% |
| 1,6-Hexanediol diacrylate/ Tunable cross-linker | HDDA | X % |
| Trimethylol propane triacrylate/ Base cross-linker | TMTPA | 1% |
| Dimethoxy-2-phenylacetophenone/ photoinitiator | DMPA | 1% |
| Benzophenone/photoinitiator | BP | 0.5% |

Difunctional acrylic ester resins (CN9014, CN9018, CN9021), 1,6-hexanediol diacrylate (HDDA), isodecyl acrylate (IDA), isobornyl acrylate (IBOA) were obtained from Sartomer Company (Exton, PA). Meanwhile, 2,2-dimethoxy-2-phenylacetophenone (DMPA), benzophenone (BP), trimethylolpropane triacrylate (TMPTA) and sodium dodecyl sulfate (SDS) were obtained from Sigma Aldrich (St. Louis, MO). Single wall carbon nanotubes (SWCNT) were obtained from NanoC, (Westwood, MA). All materials were used as received. After mixing, the compositions are liquid until cured by UV light in the absence of oxygen. Carbon nanotube electrodes were made by directly transferring SWCNT mattes from PTFE membranes onto the acrylic elastomers through stamping. The degree of SWCNT transfer was evaluated by visual inspection. The SWCNT loading used in all actuators was 7.5 mg/m$^2$. More concentrated loadings were used in measurements of the electrical resistance or interlayer adhesion forces.

Additional Material Characterization

After all elastomer layers were cured, the devices were laser cut and released. The release cut pattern traced a 1 mm edge around each active electrode and cut through the tabs to allow for electrical connections. To ensure good connections to all layers, the exposed edges of the tabs were coated with colloidal silver (Ted Pella, Redding, CA); the dried colloidal silver was protected by carbon tape and connected to the power source. The layer thicknesses were measured in cross sections using a LEXT OLS4000 Olympus Confocal Microscope. The cross-sections were prepared by laser cutting, blade cutting or freezing in liquid nitrogen and fracturing.

The mechanical testing was carried out using an Instron 5544A. For tensile testing, dog-bone samples conforming to the shape of the ISO 37 type IV standard were laser cut with a CO$_2$ 60 W Versa Laser (630-680 nm, Scottsdale, AZ). The samples were stretched in uniaxial tension while measuring the force using a 10 N load cell and the change in length. The stretch, λ, is defined as the ratio of final to initial sample length. The measurements consisted of cycles of stretching to failure or stretching and returning the sample to the initial length. The maximum stretch for these cycles corresponded to 25 or 50% of initial length. The results of tensile testing elastomer A at different cross-linker amounts are summarized in FIG. 10a, which shows stress vs. stretch curves for elastomer A with the different cross-linker concentrations indicated.

The adhesive strengths were quantified in a pull off test, conceptually similar to the ASTM D 4541 standard, in which the pristine PTFE layer (dimensions 60 mm×55 mm) was pulled away from the elastomers in the perpendicular direction. To standardize the measurements, the PTFE layer was pressed into contact with the elastomer layers for 30 seconds under a 4 N compressive load. The results are summarized in FIG. 7a.

The adhesion between successively formed elastomer layers was measured through a peel off test between two layers of 2 cm×10 cm. The first layer of elastomer was coated and cured using the standard procedure. Samples three different concentrations (7.5, 15 and 22.5 mg/m$^2$) of SWCNT electrodes, as well as a control without any carbon nanotubes, were evaluated. The electrodes were directly transferred onto the first elastomer layer, then a second layer of elastomer was coated and cured on top of the electrode (or first elastomer in the case of the control test). A section of the first layer of elastomer was protected by a spacer on which the second elastomer was coated and cured. The spacer was then used to separate the two elastomer layers, connecting just the second layer to the top vise of an Instron 5544A. The bottom layer was secured perpendicular to the direction of pull. The top vise was raised until the layers were completely detached and the force was recorded throughout.

The presence of SWCNTs reduces the interlayer adhesion between successively cast elastomer films. Nevertheless, peel tests indicated the interlayer adhesion is strong, even at high nanotube loadings (22.5 mg/m$^2$) and for low adhesion elastomers (precursor B, with 10% HDDA), as shown in FIG. 10b. In particular, FIG. 10b illustrates the pull force required to separate layers of elastomer B with 10% HDDA as a function of surface treatment applied between the layers. For the layers without carbon nanotube electrodes, the second layer was formed spin coating liquid pre-polymer on the UV cured elastomer. For the elastomer layers with a SWCNT electrode, the liquid pre-polymer was spun coated directly onto the electrode formed on the preceding elastomer layer at different SWCNT concentrations.

Furthermore, using multilayer probes, patches of conductive SWCNTs were found randomly distributed on both the separated surfaces. Other possible limitations of the fabrication method included drops in conductivity due to liquid elastomer shielding adjacent nanotubes as well as poor bonding between elastomers through dense SWCNT networks, leading to delamination. Measurements of the electrode resistance before and after casting and curing a fresh layer of elastomer on top showed no significant changes in conductivity for the network.

Figure 10C:
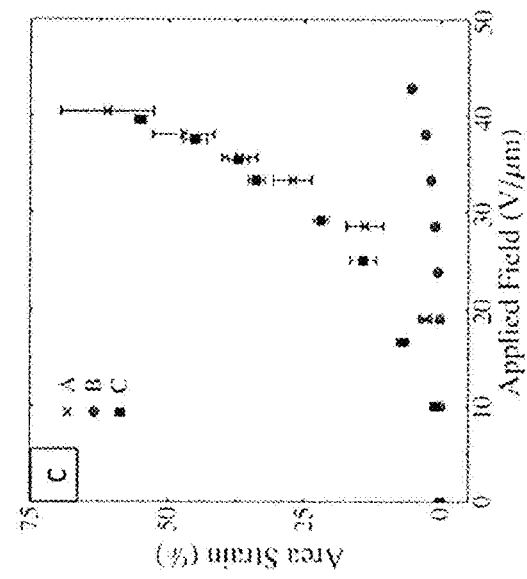
FIG. 10c is a graph showing area strain for the non-prestretched elastomers and no cross-linker as a function of applied field.
Figure 10B:
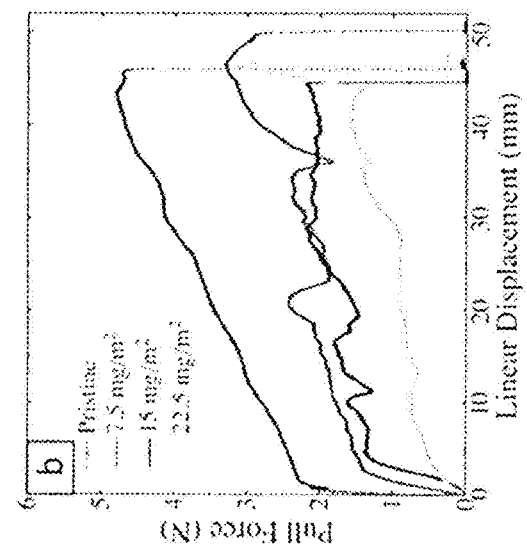
FIG. 10b is a graph illustrating the pull force required to separate layers of elastomer B with 10% HDDA as a function of surface treatment applied between the layers.
Figure 10A:
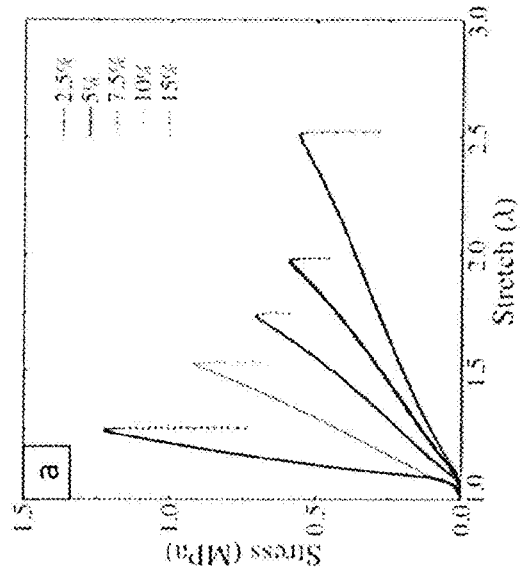
FIG. 10a is a graph showing stress vs. stretch curves for elastomer A with the different cross-linker concentrations indicated.

FIG. 10c shows area strain for the non-prestretched elastomers and no cross-linker as a function of applied field.

Figures 11A, 11B:
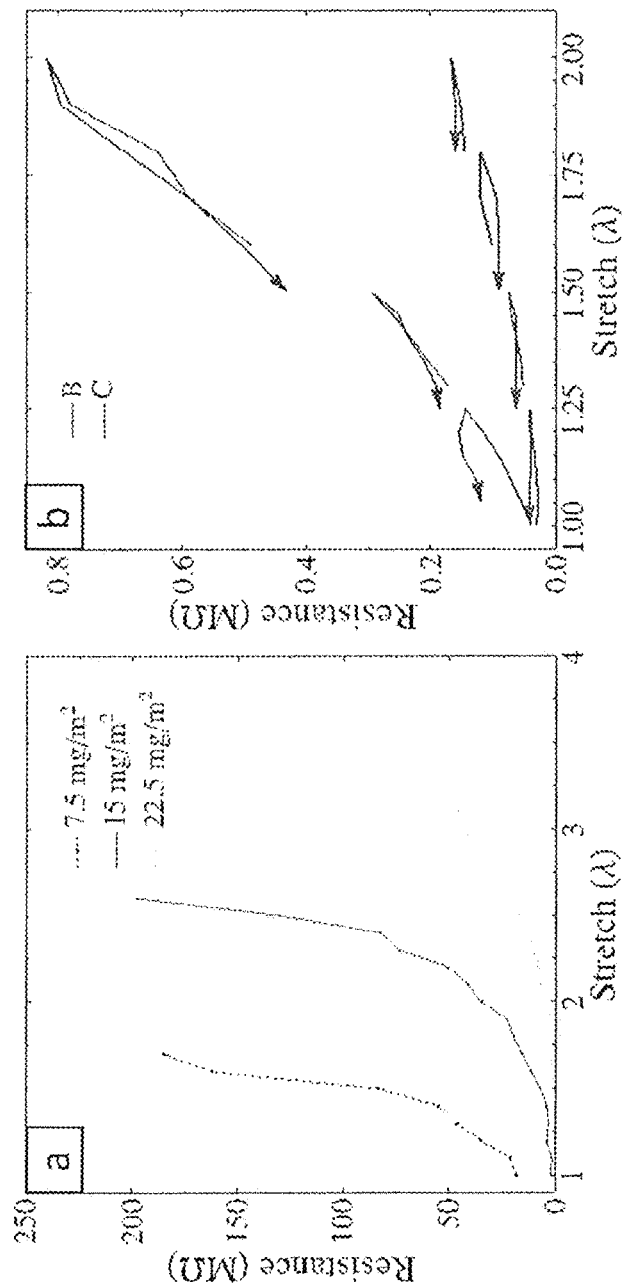
FIG. 11a is a graph showing sheet resistance as a function of stretch for elastomer A without any cross-linking at three SWCNT densities indicated.
FIG. 11b is a graph showing sheet resistance as a function of stretch for elastomer B, without any cross-linking (using 15 mg/m$^2$ SWCNT) and elastomer C, again with no cross-linking (using 22.5 mg/m$^2$ SWCNT)

The electrode resistance of the electrodes as a function of strain was evaluated using a four-point probe in contact with the electrode material. The probe consisted of four equally spaced (3 mm), spring loaded metal probes. During the measurement, a DC current was applied on the outer probes from a Keithley 6221 AC and DC current source, and the voltage measured across the inner probes using a Keithley 2701 Ethernet Multimeter. The electrode on the elastomer was stretched uniaxially and the resistance was measured at 5 or 10% increments of initial length until the sample failed or the resistance became too high to measure. The results are summarized in FIGS. 11a-b and show the conductivity increases with larger amounts of SWCNTs. In particular, FIG. 11a shows sheet resistance as a function of stretch for elastomer A without any cross-linking at three SWCNT densities indicated, and FIG. 11b shows sheet resistance as a function of stretch for elastomer B, without any cross-linking (using 15 mg/m$^2$ SWCNT) and elastomer C, again with no cross-linking (using 22.5 mg/m$^2$ SWCNT). The materials were stretched in 25% or 50% increments of their initial length, then returned to the previous maximum to evaluate if conductivity was regained. The last point in each stretching loop is indicated by an arrow to guide the eye.

For repeated electrical actuation, the electrode conductivity ideally should have minimal variation after stretch and release. Low variation in resistance as a function of stretch was observed for electrodes based on elastomer A with 0% HDDA (15 mg/m$^2$ SWCNT) and elastomer C with 0% HDDA (22.5 mg/m$^2$ SWCNT) (see FIG. 11b). Although only one cycle is shown, the small change (<5% on average) in resistance indicated that the network returns to its original conductive state after strain and release.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Various aspects of the present invention may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of making a dielectric elastomer device, comprising:
    depositing conductive particles on a first dielectric elastomer layer to form a first electrode of the dielectric elastomer device;
    applying a liquid elastomer over the conductive particles and the first dielectric elastomer layer so that a portion of the liquid elastomer permeates the first electrode, wherein the portion of the liquid elastomer that permeates the first electrode contacts portions of the first dielectric elastomer layer that are positioned under the first electrode; and
    at least partially curing the liquid elastomer to form a second dielectric elastomer layer that is directly bonded with the contacted portions of the first dielectric elastomer layer.

2. The method of claim 1, wherein the second dielectric elastomer layer is polymerized with the contacted portions of the first dielectric elastomer layer when the applied liquid elastomer is at least partially cured.

3. The method of claim 1, wherein the first dielectric elastomer layer and the liquid elastomer each comprises an acrylic elastomer.

4. The method of claim 1, wherein the first dielectric elastomer layer and the liquid elastomer each comprises a silicone elastomer.

5. The method of claim 1, wherein the first dielectric elastomer layer and the liquid elastomer each comprises a urethane elastomer.

6. The method of claim 1, wherein the conductive particles comprise nanoscale conductors.

7. The method of claim 1, wherein the conductive particles comprise conductive fibers.

8. The method of claim 7, wherein the conductive fibers comprise carbon nanotubes.

9. The method of claim 7, wherein the conductive fibers comprise silver nanowires.

10. The method of claim 1, wherein the conductive particles comprise graphene.

11. The method of claim 1, wherein the second dielectric elastomer layer comprises a top surface and a bottom surface, the bottom surface being directly bonded with the contacted portions of the first dielectric elastomer layer, and wherein the method further comprises:
    depositing additional conductive particles on the top surface of the second dielectric elastomer layer to form a second electrode of the dielectric elastomer device;
    applying an additional liquid elastomer over the additional conductive particles and the second dielectric elastomer layer so that the additional liquid elastomer covers the additional conductive particles and contacts portions of the top surface of the second dielectric elastomer layer; and
    at least partially curing the additional liquid elastomer to form a third dielectric elastomer layer that is directly bonded with the contacted portions of the top surface of the second dielectric elastomer layer.

12. The method of claim 1, wherein the dielectric elastomer device comprises a dielectric elastomer actuator or sensor.

13. A dielectric elastomer device, comprising:
    at least first and second dielectric elastomer layers; and
    a first layer of conductive particles disposed between the first and second dielectric elastomer layers and forming a first electrode of the dielectric elastomer device;
    wherein portions of the second dielectric elastomer layer permeate the first electrode, and wherein the portions of the second dielectric elastomer layer that permeate the first electrode are directly bonded with portions of the first dielectric elastomer layer that are positioned under the first electrode.

14. The dielectric elastomer device of claim 13, wherein the portions of the second dielectric elastomer layer are polymerized with the portions of the first dielectric elastomer layer through the first layer of conductive particles.

15. The dielectric elastomer device of claim 13, wherein the first and second dielectric elastomer layers each comprises an acrylic elastomer.

16. The dielectric elastomer device of claim 13, wherein the first and second dielectric elastomer layers each comprises a silicone elastomer.

17. The dielectric elastomer device of claim 13, wherein the first and second dielectric elastomer layers each comprises a urethane elastomer.

18. The dielectric elastomer device of claim 13, wherein the conductive particles comprise nanoscale conductors.

19. The dielectric elastomer device of claim 13, wherein the conductive particles comprise conductive fibers.

* * * * *